(12) United States Patent
Russell et al.

(10) Patent No.: US 11,373,844 B2
(45) Date of Patent: Jun. 28, 2022

(54) SYSTEMS AND METHODS FOR REPETITIVE TUNING OF MATCHING NETWORKS

(71) Applicant: COMET TECHNOLOGIES USA, INC., San Jose, CA (US)

(72) Inventors: Gary Russell, San Jose, CA (US); Keith Rouse, San Jose, CA (US); Dean Maw, San Jose, CA (US)

(73) Assignee: COMET TECHNOLOGIES USA, INC., San Jose, CA (US)

( * ) Notice: Subject to any disclaimer, the term of this patent is extended or adjusted under 35 U.S.C. 154(b) by 0 days.

(21) Appl. No.: 17/035,392

(22) Filed: Sep. 28, 2020

(65) Prior Publication Data
US 2022/0102115 A1   Mar. 31, 2022

(51) Int. Cl.
    H01J 37/32    (2006.01)
    H05H 1/46     (2006.01)

(52) U.S. Cl.
    CPC ......... *H01J 37/32183* (2013.01); *H05H 1/46* (2013.01); *H05H 2242/20* (2021.05)

(58) Field of Classification Search
    None
    See application file for complete search history.

(56) References Cited

U.S. PATENT DOCUMENTS

| | | | |
|---|---|---|---|
| 4,679,007 A | 7/1987 | Reese et al. | |
| 5,175,472 A | 12/1992 | Johnson, Jr. et al. | |
| 5,195,045 A | 3/1993 | Keane et al. | |
| 5,394,061 A | 2/1995 | Fujii | |
| 5,474,648 A | 12/1995 | Patrick et al. | |
| 5,576,629 A | 11/1996 | Turner et al. | |
| 5,609,737 A | 3/1997 | Fukui et al. | |
| 5,629,653 A | 5/1997 | Stimson | |
| 5,737,175 A | 4/1998 | Grosshart et al. | |
| 5,792,261 A | 8/1998 | Hama et al. | |
| 5,810,963 A | 9/1998 | Tomioka | |
| 5,842,154 A | 11/1998 | Harnett et al. | |
| 5,849,136 A | 12/1998 | Mintz et al. | |
| 5,866,869 A | 2/1999 | Schneider | |

(Continued)

FOREIGN PATENT DOCUMENTS

| JP | 04239211 A | 8/1992 |
|---|---|---|
| JP | 05284046 A | 8/1993 |

(Continued)

OTHER PUBLICATIONS

PCT/US2018/062951—International Search Report and Written Opinion of International Searching Authority, dated Aug. 28, 2019, 10 pages.

(Continued)

*Primary Examiner* — Jany Richardson
(74) *Attorney, Agent, or Firm* — Nolte Lackenback Siegel (57) ABSTRACT

A method for repetitive tuning of a matching network in a radio frequency plasma processing device, the method including detecting a condition within the matching network and determining if the condition is a known condition for the matching network. Also, finding a prior solution and to the condition when the condition is the known condition for the matching network; and replicating the prior solution for the condition in the matching network.

20 Claims, 7 Drawing Sheets

(56) References Cited

U.S. PATENT DOCUMENTS

| | | | |
|---|---|---|---|
| 5,889,252 | A | 3/1999 | Williams et al. |
| 5,910,886 | A | 6/1999 | Coleman |
| 5,914,974 | A | 6/1999 | Partlo |
| 6,016,131 | A | 1/2000 | Sato et al. |
| 6,157,179 | A | 12/2000 | Miermans |
| 6,164,241 | A | 12/2000 | Chen et al. |
| 6,252,354 | B1 | 6/2001 | Collins et al. |
| 6,313,584 | B1 | 11/2001 | Johnson et al. |
| 6,313,587 | B1 | 11/2001 | MacLennan et al. |
| 6,326,597 | B1 | 12/2001 | Lubomirsky et al. |
| 6,407,648 | B1 | 6/2002 | Johnson |
| 6,463,875 | B1 | 10/2002 | Chen et al. |
| 6,507,155 | B1 | 1/2003 | Barnes et al. |
| 6,677,828 | B1 | 1/2004 | Harnett et al. |
| 6,703,080 | B2 | 3/2004 | Reyzelman |
| 6,806,437 | B2 | 10/2004 | Oh |
| 6,876,155 | B2 | 4/2005 | Howald et al. |
| 6,894,245 | B2 | 5/2005 | Hoffman |
| 6,949,887 | B2 | 9/2005 | Kirkpatrick et al. |
| 7,030,335 | B2 | 4/2006 | Hoffman |
| 7,042,311 | B1 | 5/2006 | Hilliker et al. |
| 7,079,597 | B1 | 7/2006 | Kenwood |
| 7,102,292 | B2 | 9/2006 | Parsons et al. |
| 7,192,505 | B2 | 3/2007 | Roche et al. |
| 7,196,283 | B2 | 3/2007 | Buchberger, Jr. |
| 7,215,697 | B2 | 5/2007 | Hill et al. |
| 7,220,937 | B2 | 5/2007 | Hoffman |
| 7,251,121 | B2 | 7/2007 | Bhutta |
| 7,259,623 | B2 | 8/2007 | Coleman |
| 7,298,128 | B2 | 11/2007 | Bhutta |
| 7,467,612 | B2 | 12/2008 | Suckewer |
| 7,514,936 | B2 | 4/2009 | Anwar |
| 7,795,877 | B2 | 9/2010 | Radtke |
| 7,796,368 | B2 | 9/2010 | Kotani |
| 8,169,162 | B2 | 5/2012 | Yuzurihara |
| 8,203,372 | B2 | 6/2012 | Arduini |
| 8,222,822 | B2 | 7/2012 | Gilbert |
| 8,421,377 | B2 | 4/2013 | Kirchmeier |
| 8,466,622 | B2 | 6/2013 | Knaus |
| 8,471,746 | B2 | 6/2013 | Kurunezi et al. |
| 8,491,759 | B2 | 7/2013 | Pipitone et al. |
| 8,742,669 | B2 | 6/2014 | Carter et al. |
| 8,779,662 | B2 | 7/2014 | Boston |
| 8,803,424 | B2 | 8/2014 | Boston |
| 8,884,180 | B2 | 11/2014 | Ilie |
| 8,896,391 | B2 | 11/2014 | du Toit |
| 8,928,229 | B2 | 1/2015 | Boston |
| 9,042,121 | B2 | 5/2015 | Walde et al. |
| 9,065,426 | B2 | 6/2015 | Mason et al. |
| 9,105,447 | B2 | 8/2015 | Brouk et al. |
| 9,111,725 | B2 | 8/2015 | Boston |
| 9,124,248 | B2 | 9/2015 | Van Zyl et al. |
| 9,142,388 | B2 | 9/2015 | Hoffman et al. |
| 9,148,086 | B2 | 9/2015 | Fife et al. |
| 9,166,481 | B1 | 10/2015 | Vinciarelli |
| 9,171,700 | B2 | 10/2015 | Gilmore |
| 9,196,459 | B2 | 11/2015 | Bhutta |
| 9,208,992 | B2 | 12/2015 | Brouk et al. |
| 9,224,579 | B2 | 12/2015 | Finley et al. |
| 9,225,299 | B2 | 12/2015 | Mueller et al. |
| 9,287,098 | B2 | 3/2016 | Finley et al. |
| 9,294,100 | B2 | 3/2016 | Van Zyl et al. |
| 9,306,533 | B1 | 4/2016 | Mavretic |
| 9,313,870 | B2 | 4/2016 | Walde et al. |
| 9,337,804 | B2 | 5/2016 | Mason et al. |
| 9,345,122 | B2 | 5/2016 | Bhutta |
| 9,385,021 | B2 | 7/2016 | Chen |
| 9,418,822 | B2 | 8/2016 | Kaneko |
| 9,478,397 | B2 | 10/2016 | Blackburn et al. |
| 9,483,066 | B2 | 11/2016 | Finley et al. |
| 9,490,353 | B2 | 11/2016 | Van Zyl et al. |
| 9,496,122 | B1 | 11/2016 | Bhutta |
| 9,520,269 | B2 | 12/2016 | Finley et al. |
| 9,524,854 | B2 | 12/2016 | Hoffman et al. |
| 9,525,412 | B2 | 12/2016 | Mavretic |
| 9,536,713 | B2 | 1/2017 | Van Zyl et al. |
| 9,543,122 | B2 | 1/2017 | Bhutta |
| 9,544,987 | B2 | 1/2017 | Mueller et al. |
| 9,558,917 | B2 | 1/2017 | Finley et al. |
| 9,577,516 | B1 | 2/2017 | Van Zyl et al. |
| 9,584,090 | B2 | 2/2017 | Mavretic |
| 9,578,731 | B2 | 3/2017 | Hoffman et al. |
| 9,591,739 | B2 | 3/2017 | Bhutta |
| 9,589,767 | B2 | 4/2017 | Finley et al. |
| 9,620,340 | B2 | 4/2017 | Finley et al. |
| 9,651,957 | B1 | 5/2017 | Finley et al. |
| 9,660,613 | B2 | 5/2017 | Van Zyl et al. |
| 9,673,028 | B2 | 6/2017 | Walde et al. |
| 9,697,911 | B2 | 7/2017 | Bhutta |
| 9,711,331 | B2 | 7/2017 | Mueller et al. |
| 9,711,335 | B2 | 7/2017 | Christie et al. |
| 9,728,378 | B2 | 8/2017 | Bhutta et al. |
| 9,729,122 | B2 | 8/2017 | Mavretic |
| 9,741,544 | B2 | 8/2017 | Van Zyl et al. |
| 9,745,660 | B2 | 8/2017 | Bhutta |
| 9,748,076 | B1 | 8/2017 | Choi et al. |
| 9,755,641 | B1 | 9/2017 | Bhutta |
| 9,773,644 | B2 | 9/2017 | Van Zyl et al. |
| 9,807,863 | B1 | 10/2017 | Van Zyl et al. |
| 9,812,305 | B2 | 11/2017 | Pelleymounter et al. |
| 9,844,127 | B2 | 12/2017 | Bhutta |
| 9,852,890 | B2 | 12/2017 | Mueller et al. |
| 9,854,659 | B2 | 12/2017 | Van Zyl et al. |
| 9,865,432 | B1 | 1/2018 | Bhutta |
| 9,952,297 | B2 | 4/2018 | Wang |
| 10,008,317 | B2 | 6/2018 | Iyer |
| 10,020,752 | B1 | 7/2018 | Vinciarelli |
| 10,026,592 | B2 | 7/2018 | Chen |
| 10,026,594 | B2 | 7/2018 | Bhutta |
| 10,026,595 | B2 | 7/2018 | Choi et al. |
| 10,074,518 | B2 | 9/2018 | Van Zyl et al. |
| 10,139,285 | B2 | 11/2018 | Murray et al. |
| 10,141,788 | B2 | 11/2018 | Kamstedt |
| 10,194,518 | B2 | 1/2019 | Van Zyl et al. |
| 10,217,618 | B2 | 2/2019 | Larson et al. |
| 10,224,184 | B2 | 3/2019 | Van Zyl |
| 10,224,186 | B2 | 3/2019 | Polak et al. |
| 10,263,577 | B2 | 4/2019 | Van Zyl et al. |
| 10,269,540 | B1 | 4/2019 | Carter et al. |
| 10,314,156 | B2 | 6/2019 | Van Zyl et al. |
| 10,332,730 | B2 | 6/2019 | Christie et al. |
| 10,340,879 | B2 | 7/2019 | Mavretic |
| 10,373,811 | B2 | 8/2019 | Christie et al. |
| 10,374,070 | B2 | 8/2019 | Wood |
| 10,410,836 | B2 | 9/2019 | McChesney |
| 10,411,769 | B2 | 9/2019 | Bae |
| 10,447,174 | B1 | 10/2019 | Porter, Jr. et al. |
| 10,469,108 | B2 | 11/2019 | Howald |
| 10,475,622 | B2 | 11/2019 | Pankratz et al. |
| 2003/0150710 | A1 | 8/2003 | Evans et al. |
| 2003/0230984 | A1 | 12/2003 | Kitamura et al. |
| 2004/0026235 | A1 | 2/2004 | Stowell, Jr. |
| 2005/0045475 | A1 | 3/2005 | Wantanabe |
| 2005/0270805 | A1 | 12/2005 | Yasumura |
| 2006/0005928 | A1 | 1/2006 | Howald |
| 2006/0169582 | A1 | 8/2006 | Brown et al. |
| 2006/0169584 | A1 | 8/2006 | Brown et al. |
| 2007/0121267 | A1 | 5/2007 | Kotani |
| 2008/0061793 | A1 | 3/2008 | Anwar et al. |
| 2008/0061901 | A1 | 3/2008 | Gilmore |
| 2008/0317974 | A1 | 12/2008 | de Vries |
| 2009/0026964 | A1 | 1/2009 | Knaus |
| 2010/0012029 | A1 | 1/2010 | Forester et al. |
| 2010/0096261 | A1 | 4/2010 | Hoffman et al. |
| 2010/0098882 | A1 | 4/2010 | Lubomirsky et al. |
| 2011/0121735 | A1 | 5/2011 | Penny |
| 2011/0140607 | A1 | 6/2011 | Moore et al. |
| 2011/0148303 | A1 | 6/2011 | Van Zyl et al. |
| 2012/0097104 | A1 | 4/2012 | Pipitone et al. |
| 2012/0097524 | A1 | 4/2012 | Pipitone et al. |
| 2012/0145322 | A1 | 6/2012 | Gushiken et al. |
| 2012/0262064 | A1 | 10/2012 | Nagarkatti |
| 2013/0140984 | A1 | 6/2013 | Hirayama |
| 2013/0180964 | A1 | 7/2013 | Ilic |

(56) References Cited

U.S. PATENT DOCUMENTS

| | | | |
|---|---|---|---|
| 2013/0214683 | A1 | 8/2013 | Valcore et al. |
| 2013/0278140 | A1 | 10/2013 | Mudunuri et al. |
| 2013/0345847 | A1 | 12/2013 | Valcore et al. |
| 2014/0225504 | A1 | 8/2014 | Kaneko |
| 2014/0239813 | A1 | 8/2014 | Van Zyl |
| 2014/0265911 | A1 | 9/2014 | Kamata et al. |
| 2014/0367043 | A1 | 12/2014 | Bishara et al. |
| 2015/0002020 | A1 | 1/2015 | Boston |
| 2015/0115797 | A1 | 4/2015 | Yuzurihara |
| 2015/0150710 | A1 | 6/2015 | Evans et al. |
| 2015/0313000 | A1 | 10/2015 | Thomas et al. |
| 2016/0002020 | A1 | 1/2016 | Orita |
| 2016/0248396 | A1 | 8/2016 | Mavretic |
| 2016/0308560 | A1 | 10/2016 | Howald et al. |
| 2017/0133886 | A1 | 5/2017 | Kurs et al. |
| 2017/0338081 | A1 | 11/2017 | Yamazawa |
| 2017/0345620 | A1 | 11/2017 | Coumou et al. |
| 2018/0034446 | A1 | 1/2018 | Wood |
| 2018/0261431 | A1 | 9/2018 | Hammond, IV |
| 2019/0172683 | A1 | 6/2019 | Mavretic |
| 2019/0199241 | A1 | 6/2019 | Satoshi et al. |
| 2019/0326094 | A1* | 10/2019 | Bhutta .................. H03H 7/38 |

FOREIGN PATENT DOCUMENTS

| | | |
|---|---|---|
| WO | 2012054305 | 4/2012 |
| WO | 2012054306 | 4/2012 |
| WO | 2012054307 | 4/2012 |
| WO | 2016048449 A1 | 3/2016 |
| WO | 2016097730 | 6/2016 |
| WO | 2019096564 A1 | 5/2019 |

OTHER PUBLICATIONS

Stowell, et al., "RF-superimposed DC and pulsed DC sputtering for deposition of transparent conductive oxides", Thin Solid Films 515 (2007), pp. 7654-7657.

Bender, et al., "Characterization of a RF=dc-magnetron discharge for the sputter deposition of transparent and highly conductive ITO films", Appl. Phys. A 69, (1999), pp. 397-409.

Economou, Demetre J., "Fundamentals and application of ion-ion plasmas", Applied Surface Science 253 (2007), pp. 6672-6680.

Godyak et al., "Plasma parameter evolution in a periodically pulsed ICP", XXVIIth, Eindhoven, the Netherlands, Jul. 18-22, 2005, 4 pages.

Banna, et al., "Inductively Coupled Pulsed Plasmas in the Presence of Synchronous Pulsed Substrate Bias for Robust, Reliable, and Fine Conductor Etching", IEEE Transactions on Plasma Science, vol. 37, No. 9, Sep. 2009, pp. 1730-1746.

Kushner, Mark J., "Pulsed Plasmas as a Method to Improve Uniformity During Materials Processing", Journal of Applied Physics, Jul. 1, 2004, vol. 96, No. 1, pp. 82-93.

LTM Technologies, M. Haass "Synchronous Plasma Pulsing for Etch Applications", Apr. 3, 2010 16 pages.

PCT/US2020/038892—International Search Report and Written Opinion of the International Searching Authority, dated Oct. 6, 2020, 3 pages.

PCT/US2020/038899—International Search Report and Written Opinion of the International Searching Authority, dated Sep. 26, 2019, 5 pag.

* cited by examiner

SYSTEMS AND METHODS FOR REPETITIVE TUNING OF MATCHING NETWORKS

BACKGROUND

Radio frequency plasma-enhanced processing is extensively used in semiconductor manufacturing to etch different types of films, deposit thin films at low to intermediate processing temperatures, and perform surface treatment and cleaning. Characteristic of such processes is the employment of a plasma, i.e., a partially ionized gas, that is used to generate neutral species and ions from precursors inside a reaction chamber, provide energy for ion bombardment, and/or perform other actions. Radio frequency plasma-enhanced processing is performed by what are known as radio frequency processing devices.

Radio frequency processing devices may include a radio frequency generator that transmits a signal to a plasma reaction chamber. A radio frequency matching device, which may have a variable impedance, may be located between the radio frequency generator and the plasma reaction chamber. The radio frequency matching device may be controlled, or otherwise tuned by varying the impedance of the radio frequency matching device. Tuning the radio frequency matching device reduces reflected power from the plasma reaction chamber and/or the radio frequency matching device, which may increase power that is transferred from the radio frequency generator to the plasma reaction chamber and into the plasma process.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

DETAILED DESCRIPTION

Illustrative examples of the subject matter claimed below will now be disclosed. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Further, as used herein, the article "a" is intended to have its ordinary meaning in the patent arts, namely "one or more." Herein, the term "about" when applied to a value generally means within the tolerance range of the equipment used to produce the value, or in some examples, means plus or minus 10%, or plus or minus 5%, or plus or minus 1%, unless otherwise expressly specified. Further, herein the term "substantially" as used herein means a majority, or almost all, or all, or an amount with a range of about 51% to about 100%, for example. Moreover, examples herein are intended to be illustrative only and are presented for discussion purposes and not by way of limitation.

Embodiments of the present disclosure may provide systems and methods for tuning and otherwise controlling matching networks in radio frequency plasma processing devices. During operation, a radio frequency generator may be energized to form a plasma within a reaction chamber. The plasma may be produced after a source gas is injected into the reaction chamber and power is supplied within the reaction chamber by the radio frequency generator.

Under certain conditions, the power that is supplied to the reaction chamber may be reflected back from the reaction chamber. When power is reflected back, the process may be less efficient and/or wafers that are being processed may be damaged. The cause of the reflected power may be a mismatch in the impedance of the radio frequency generator and a load formed by the plasma within the reaction chamber. To help prevent reflected power, a matching network may be disposed between the radio frequency generator and the reaction chamber. Such matching networks may include a number of variable capacitors or other impedance elements. The variable capacitors may be tuned so that the complex load impedance within the reaction chamber matches the impedance of the radio frequency generator.

While multiple methods of controlling or otherwise tuning matching networks have been used, such methods may not reliably and efficiently result in impedance matching. Methods of tuning matching networks may include controlling the matching networks to control the current split ratio, which may minimize reflected power seen at the radio frequency generator. The current split ratio is the current split between, for example, inner and outer source coils. Certain variable capacitors may be used to control the current split ratio within a desired operational range.

Matching networks using current split ratio may have several drawback including, for example, limited current split ratio ranges, high coil voltages, coil arcing, and the like. Current matching networks using current split ratio that are not currently tuned may result in less efficient operation, damage to radio frequency processing device components, and decreased yield due to undesired particulate deposition on wafers within the reaction chamber.

Embodiments of the present disclosure may provide systems and methods for the repetitive tuning of matching networks using current split ratio values that minimize, or at least address, the currently experienced problems identified above. In certain embodiments, capacitor positions for tuned impedance points may be learned, such that when a condition exists, for example the current split ratio falls out of a desired operational range, there is a spike in reflected power, etc., the capacitors may be automatically adjusted. The automatic adjustment may occur as a result of learned capacitor positions that may be used to correct the condition that is occurring within the plasma processing device. By learning capacitor positions that correct certain conditions, when a condition is detected, the matching networks may be automatically tuned by applying a known solution that corrects the condition. For example, the known solution may include adjusting a property of one or more capacitors within the matching network.

Such embodiments may provide enhanced efficiency for plasma processing by allowing faster and more accurate adjustments to matching networks. As such, the matching networks may be repetitively tuned during processing, so that when a condition is detected, the known solution is applied without taking additional time that would otherwise detrimentally effect plasma processing. Additionally, when a condition for which there is not a known solution occurs, the capacitors may be adjusted, and when the condition is resolved, the solution may be stored for future use, should the condition subsequently occur. Because the solution may be stored, the matching networks may have access to an evolving database of solutions and recipes that allows plasma processing to become increasingly efficient. Exemplary systems and methods are provided below.

Figure 1:
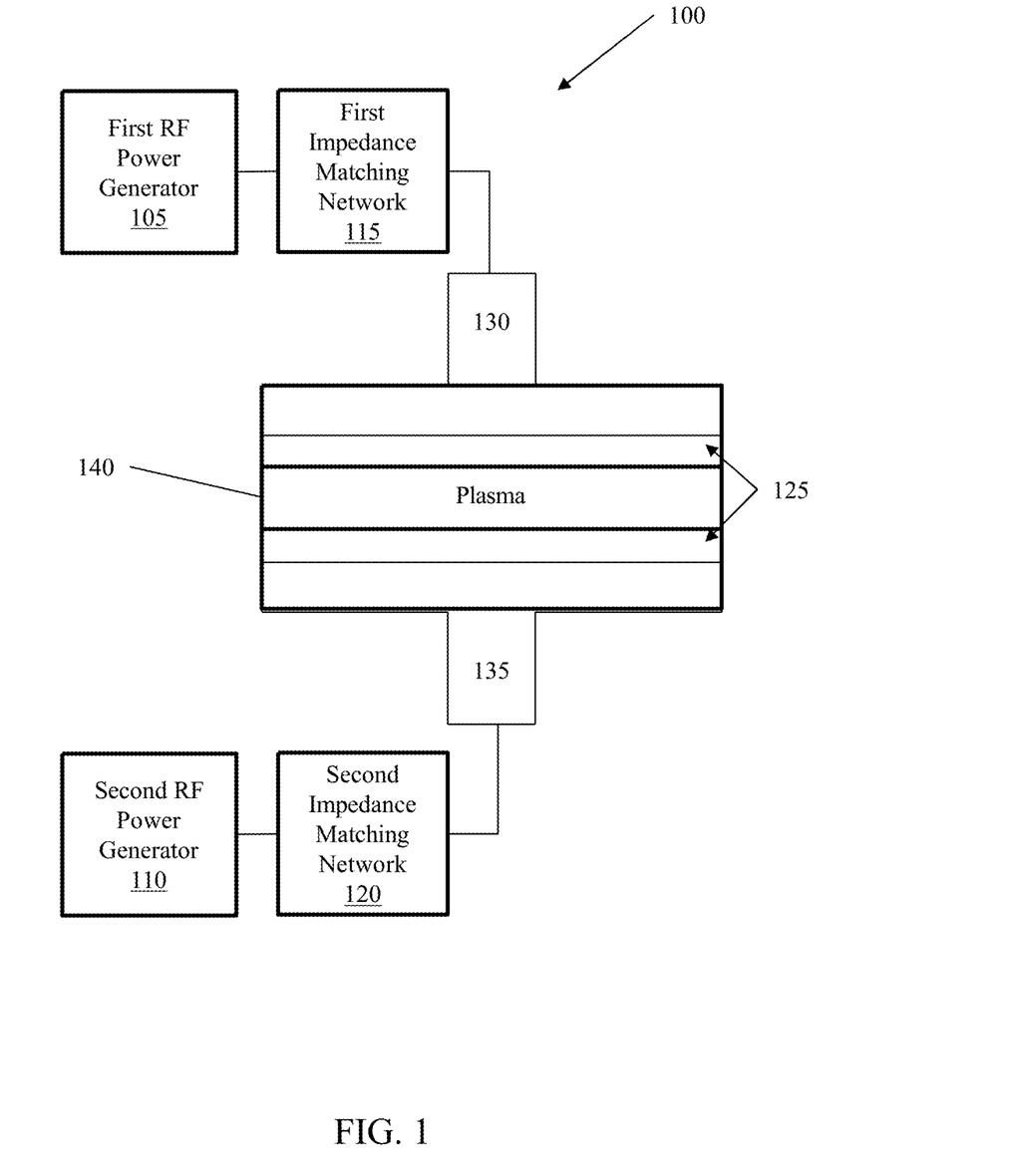
FIG. 1 is a schematic representation of a radio frequency plasma processing device according to embodiments of the present disclosure.

Turning to FIG. 1, a side view schematic representation of a radio frequency plasma processing system 100, according to embodiments of the present disclosure is shown. Radio frequency plasma processing system 100 includes a first radio frequency generator 105 and a second radio frequency generator 110, a first impedance matching network 115, a second impedance matching network 120, a sheath 125, a plasma powering device, such as showerhead 130 or equivalent powered element such as an electrode, and a pedestal 135. As used herein, plasma power devices may refer to any device that introduces power to generate plasma and may include, for example, showerhead 130 and/or other types of electrodes, as well as antennae and the like.

Radio frequency plasma processing system 100 may include one or more first and second radio frequency generators 105, 110 that deliver power to a reaction chamber 140 through one or more impedance matching networks 115, 120. Radio frequency power flows from the first radio frequency generator 105 through the first impedance matching network 115 to showerhead 130 into plasma in reaction chamber 140, to an electrode (not shown) other than showerhead 130, or to an inductive antenna (not shown) that electromagnetically provides power to the plasma. After which the power flows from the plasma to ground and/or to pedestal 135 and/or to second impedance matching network 120. Generally, first impedance matching network 115 compensates for variations in a load impedance inside reaction chamber 140 so the combined impedance of showerhead 130 and first impedance matching network 115 equal the output of first radio frequency generator 105, e.g., 50 ohms, by adjusting the reactive components (not separately shown), e.g., variable capacitors, within first impedance matching network 115.

In certain examples, first radio frequency generator 105 may provide power at a RF frequency between about 400 KHz and 150 MHz, while second radio frequency generator 110 connected to pedestal 135 may supply power at a radio frequency lower than that of first radio frequency generator 105. However, in certain implementations, second radio frequency generator 110 may not supply power at a radio frequency lower than that of first radio frequency generator 105. Typically, the frequencies of first and second radio frequency generators 105, 110 are such that first radio frequency generator 105 is at a radio frequency that is not an integer multiple, nor integer fraction, of the frequency of second radio frequency generator 110.

Impedance matching networks 115, 120 are designed to adjust their internal reactive elements such that the load impedance matches the source impedance. In other examples of the plasma processing device 100, different numbers of radio frequency power generators 105/110 may be used, as well as different numbers of impedance matching networks 115/120. Impedance matching networks 115/120 may include a number of internal components, such as coils and variable capacitors, which will be discussed in greater detail below.

Figure 2:
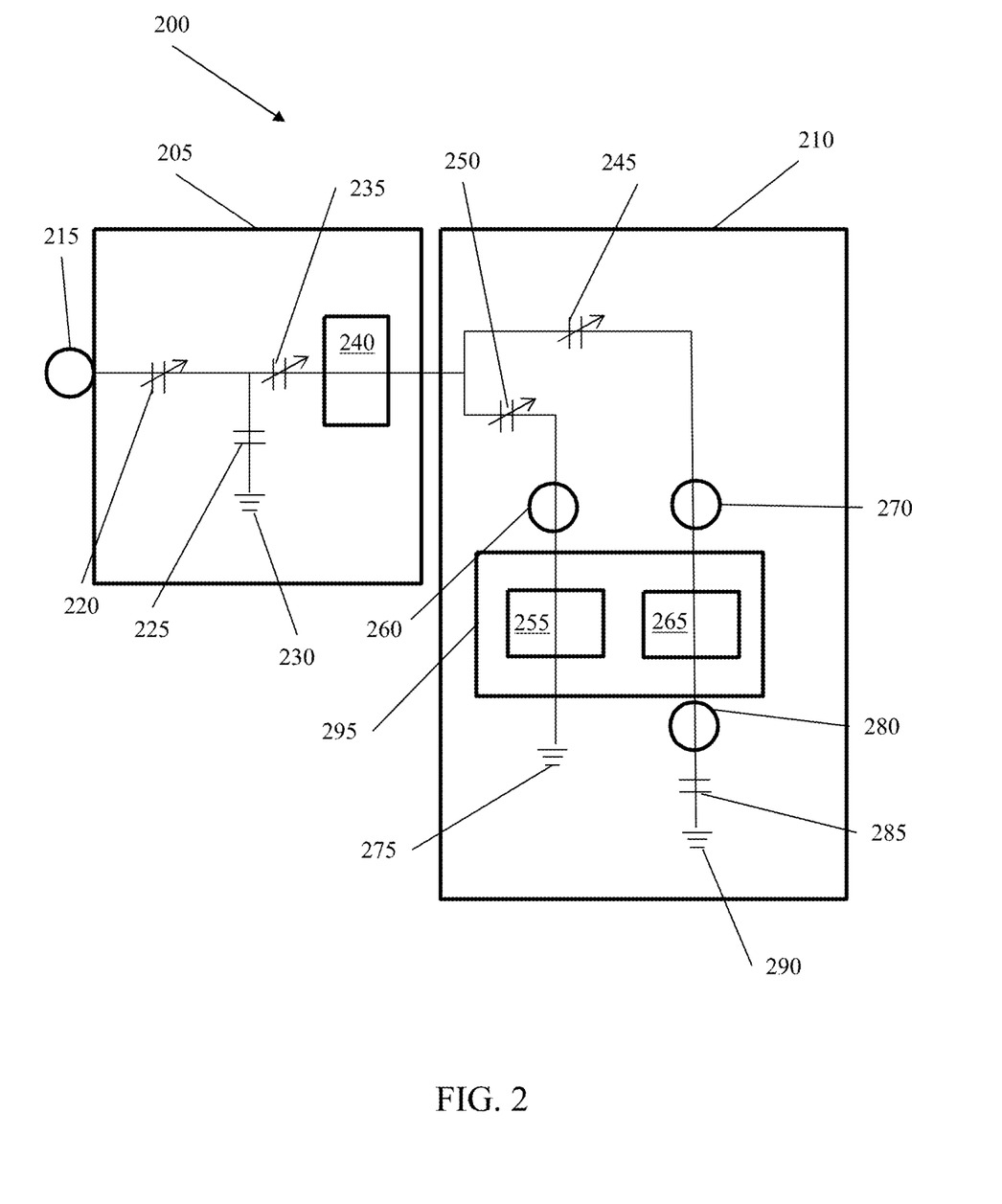
FIG. 2 is a schematic representation of a matching network according to embodiments of the present disclosure.

Turning to FIG. 2, a schematic representation of a matching network according to embodiments of the present disclosure is shown. In this embodiments, a matching network 200, such as those described above with respect to FIG. 1, is illustrated having a matching branch 205 and a splitter branch 210. Matching branch 205 receives radio frequency power from an input 215. A first variable capacitor 220 of the matching branch 205 receives the radio frequency power from the input 215. First variable capacitor 220 may include a capacitor rated at approximately 10-2000 pF.

First variable capacitor 220 is connected to a second capacitor 225, which is connected to a ground 230. Second capacitor 225 is also connected to a third variable capacitor 235. Third variable capacitor 235 may include a capacitor rated at approximately 10-2000 pF. Third variable capacitor 235 is also connected to an inductor 240, which further connects to splitter branch 210.

Splitter branch 210 receives radio frequency power from matching branch 205, which, splits the received radio frequency power between a fourth variable capacitor 245 and a fifth variable capacitor 250. Fourth variable capacitor 245 may be rated at approximately 10-2000 pF, while fifth variable capacitor 250 may be rated at approximately 10-2000 pF.

Fourth variable capacitor 245 is connected to an inner coil 255. Between fourth variable capacitor 245 and inner coil 255, one or more sensors 260 may be disposed. Sensor 260 may be used to measure, for example, voltage between fourth variable capacitor 245 and inner coil 255. Similarly, fifth variable capacitor 250 is connected to an outer coil 265. Between fifth variable capacitor 250 and outer coil 265, one or more sensors 270 may be disposed. Sensors 270 may be used to measure, for example, voltage between fifth variable capacitor and outer coil 265.

Inner coil 255 may further be connected to a ground 275 and outer coil 265 may be connected to circuitry that include a sensor 280 and a sixth capacitor 285. Sensor 280 may be used to measure, for example, voltage between outer coil 265 and sixth capacitor 285, which is connected to a ground 290. Inner coil 255 and outer coil 265 may be located outside of the matching network 200 circuitry, as indicated by offset box 295.

As discussed above, the circuitry illustrated in FIG. 2 may be used to tune first variable capacitor 220, third variable capacitor 235, fourth variable capacitor 245, and fifth variable capacitor 250. By tuning first variable capacitor 220, third variable capacitor 235, fourth variable capacitor 245, and fifth the power provided to inner coil 255 and outer coil 265 may be adjusted.

The circuitry, which in one embodiment may be employed in matching network 200 as a current split ratio matching network, may be controlled using a programmable logic controller (not shown), which may be disposed in or otherwise connected to matching network 200. Suitable programmable logic controllers and associated components will be discussed further with respect to FIG. 3.

In other embodiments, the circuitry of matching network 200 may include fewer or additional components, and the orientation of the circuitry may differ. For example, fewer or greater numbers of variable capacitors, inductors, sensors, and the like may be present. Additionally, in certain embodiments, a different orientation of coils, antennas, and the like may be used to provide tuned radio frequency power to a reaction chamber (not shown in FIG. 2). Systems and methods disclosed herein may be used with transformer coupled plasmas ("TCPs"), inductively coupled plasmas ("ICPs"), capacitively coupled plasmas ("CCPs"), helicon wave sources ("HWSs"), or any other plasma processing devices.

Figure 3:
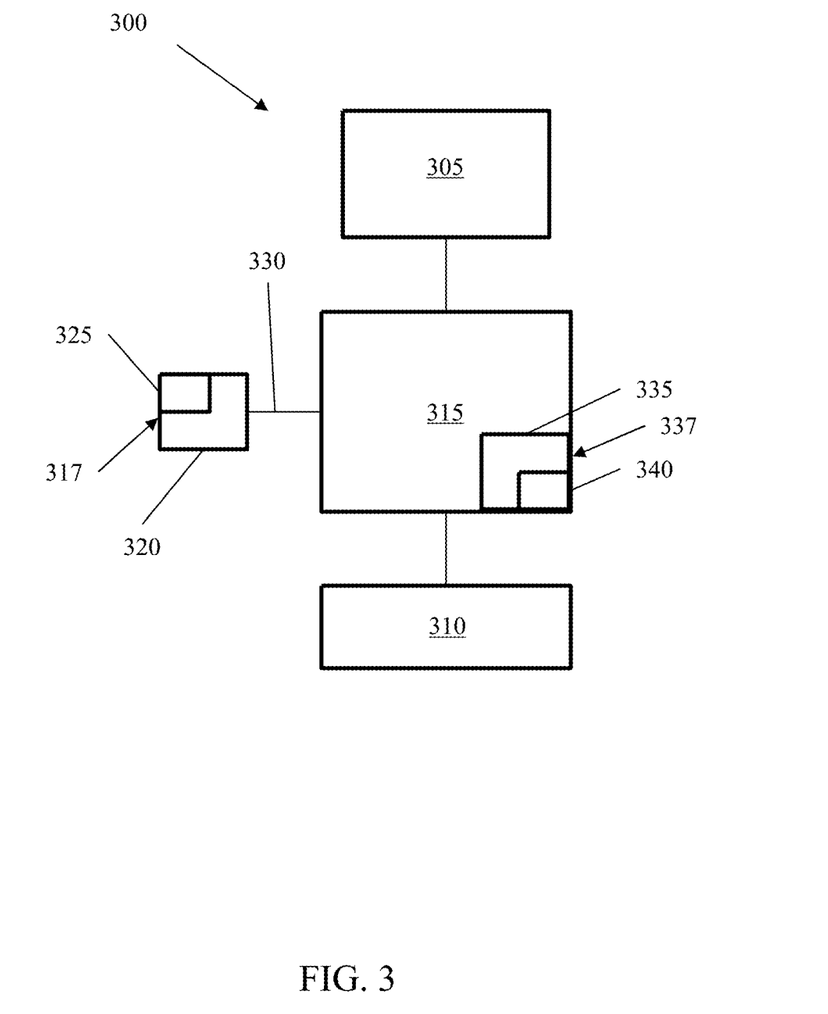
FIG. 3 is a schematic representation of a plasma processing device according to embodiments of the present disclosure.

Turning to FIG. 3, a schematic representation of a radio frequency plasma processing device according to embodiments of the present disclosure is shown. In this embodiment, a radio frequency plasma processing device 300 includes a radio frequency generator 305. Radio frequency generator 305 is configured to provide power to reaction chamber 310. Radio frequency generator 305 may provide power at a radio frequency between about 400 KHz and about 150 KHz. In certain embodiments, a second radio frequency generator (not shown) may also be present within radio frequency plasma processing device 300 and may provide power at a radio frequency that is the same, lower, or higher than radio frequency generator 305.

Reaction chamber 310 may include various components that allow for the processing of a manufacturing operation, such as those associated with the semiconductor industries. Reaction chamber 310 may include one or more sensors (not shown) for measuring certain properties occurring within reaction chamber 310. Reaction chamber 310 may also include a pedestal (not shown) on which substrates to be manufactured may be placed during operation. Reaction chamber 310 may also include or otherwise be connected to coils (not individually shown), such as those discussed above, as well as showerheads, etc.

Radio frequency plasma processing device 300 may also include a matching network 315. Matching network 315 may be located between radio frequency generator 305 and reaction chamber 310. Matching network 315 may include variable capacitors (not shown), as well as other components to balance impedance between radio frequency generator 305 and reaction chamber 310, as discussed in greater detail above. During operation, the matching network may be tuned, e.g., by adjusting capacitor positions, in order to provide the matching impedances.

In order to provide faster tuning and repeatability in manufacturing processes, matching network 315 may be connected to a tuning module 317. Tuning module 317 may include one or more programmable logic controllers 320. Programmable logic controller 320 may have access to a storage device 325, such as memory, which in certain embodiments may include a non-transitory computer readable medium that is configured to store computer executable instructions. Storage device 325 may be integrated within tuning module 317 or may be located remotely at a separate physical location. Storage device 325 may be directly connected to programmable logic controller 320, as is illustrated in FIG. 3, while in other embodiments, storage device 325 may be remote from programmable logic controller 320. For example, storage device 325 may be connected to programmable logic controller 320 through a wired or wireless connection, thereby allowing storage device 325 to be located at a different physical location from radio frequency plasma processing device 300.

Programmable logic controller 320 may be connected to matching network 315 through various types of connections 330. For example, connections 330 may include wired connections or wireless connections. In still other embodiments, matching network 315 may include a tuning module 337 that has a programmable logic controller 335, including a storage device 340, that is located in or on matching network 315. Programmable logic controllers 320 and 335 may function the same, regardless of their location with respect to matching network 310 and/or radio frequency plasma processing device 300.

During operation, as power is supplied from radio frequency generator 305 to plasma (not shown) within reaction chamber 310, a condition may occur, such as power may be reflected from reaction chamber 310. Such reflected power may result in undesirable conditions within reaction chamber 310, which result in inefficient processing, damage to a substrate, damage to components of radio frequency plasma processing device 300, and the like. To resolve the condition and improve operability of radio frequency processing device 300 programmable logic controllers 320 or 335 may provide commands to matching network 315 to adjust a capacitor position, thereby providing matching impedances to minimize reflected power.

Storage device 325 or 340 may contain a database of known conditions that occur within radio frequency processing device 300 during operation. The known conditions may be associated with values of radio frequency generator 305, matching network 315, reaction chamber 310, and/or various components thereof. For example, a condition may be associated with a certain level of power provided by radio frequency generator 305 and matching network 315 capacitor positions. When the condition is detected, programmable logic controller 320 may execute instructions/commands to search a database of known conditions within storage device 325. When a known condition is identified within the database, the known condition may be associated with a prior solution. Programmable logic controller 320 may then execute instructions to replicate the prior solution within matching network 315 in order to resolve the condition within radio frequency processing device 300.

The prior solution, in this particular example, refers to empirical data that was collected when the condition previously occurred. For example, if a condition is detected, but it is determined that the condition is not a known condition, and as such, there is not a prior solution, aspects of matching network 315 or other components of radio frequency processing device 300 may be adjusted. When the condition is resolved, a prior solution may then be associated with a known condition. The known condition may then be saved in the database for future use. As such, when the condition occurs again, when the database is searched for a known condition, the known condition may be found associated with a prior solution. The prior solution may then be applied without having to spend additional time determining the solution to the condition. As such, the speed of resolving a condition within radio frequency processing device 300 may be increased, thereby resulting in improved manufacturing efficiency, etc.

The known conditions may be created as specified above, through collecting data during operation, and saving the data for future use. The known conditions may also be imported from other radio frequency processing devices 300. A network of radio frequency processing devices 300 may be created, thereby increasing data in the database faster. For example, radio frequency processing device 300 may experience a condition, for which no known solution is found in its database. However, the solution may be in a network database accessible by programmable logic controllers 320 or 335. The known condition may have occurred in a second radio frequency processing device (not shown). As the data is accessibly by programmable logic controllers 320 or 335 of radio frequency processing device 300, the condition may still be resolved faster because the known condition had already occurred in a different radio frequency processing device.

Because the conditions, known conditions, and prior solutions are based on empirical data, there is greater accuracy in applying a solution to a condition. Solutions for conditions based on guesses, e.g., the solutions are not based on actual data, may not work, or may not work as well as solutions created by the empirical data. Additionally, because a prior solution for a condition is known to have been effective, there is greater repeatability in the application of the solution, thereby improving efficiency of the operation.

In certain embodiments, current split ratio s may be stored in the database/data structure and used to identify a condition. For example, a calculated current split ratio may be, or may be associated with, a condition, thereby allowing a known condition to be stored in the database. The current split ratio may be associated with a prior solution, such as a capacitor position for a tuned impedance point. As such, the current split ratio may be used to identify a known condition and thereby allow a prior solution to be applied within matching network 315.

The database in storage device 325 or programmable logic controller 335 may also be uploaded with data provided by operators. For example, an operator may upload various known conditions, current split ratios, prior solutions, and the like, the further increase the robustness of the available data. In still other embodiments, operational recipes, such as recipe specific current split ratio tables may be stored in storage device 325 or programmable logic controller 335, thereby making entire recipes for specific operations available. By storing the recipes for specific operations, matching network 315 may me adjust more quickly when conditions occur, or otherwise preventing conditions from occurring in the first place. In either instance, the effectiveness of the manufacturing process may be increased.

In embodiments, such as those discussed above with respect to FIG. 2, where two coils are used, capacitors associated with the inner and outer coils, i.e., fourth capacitor and fifth capacitor may be allowed to tune with high reflected power at limited speed. Values for specific capacitors, such as first capacitor, third capacitor, fourth capacitor, and/or fifth capacitor of FIG. 2 may be stored and or associated with conditions, thereby allowing the capacitors to be adjusted during operation. Additionally, the speed of capacitors may be controlled based on a percentage of reflected power. Furthermore, As conditions occur that are not known, and solutions are generated for the unknown conditions, prior solutions may be associated in the database with specific conditions. The longer radio frequency processing device 300 operates, the more conditions will occur, and thus, the more solutions will be generated. In view of the number of conditions that may occur, tuning module 337 may be trained with respect to conditions and solutions. As such, the process allows the executable instructions to learn over time, thereby resulting in a larger database of known conditions and solutions, which further increases the speed of resolving conditions.

Additionally, because programmable logic controller 320 or programmable logic controller 335 has access to a database of empirical data, recipe tables, known conditions, prior solutions, etc., the process can be substantially automated. As such, during operation the capacitors in matching network 315 may be automatically tuned to specific positions. Such auto-tuning of capacitor position may thereby increase the speed of resolving conditions, as well as increase operational efficiency. The learning, as discussed above, may also occur automatically, thereby creating real-time updates to the stored data.

Figure 4:
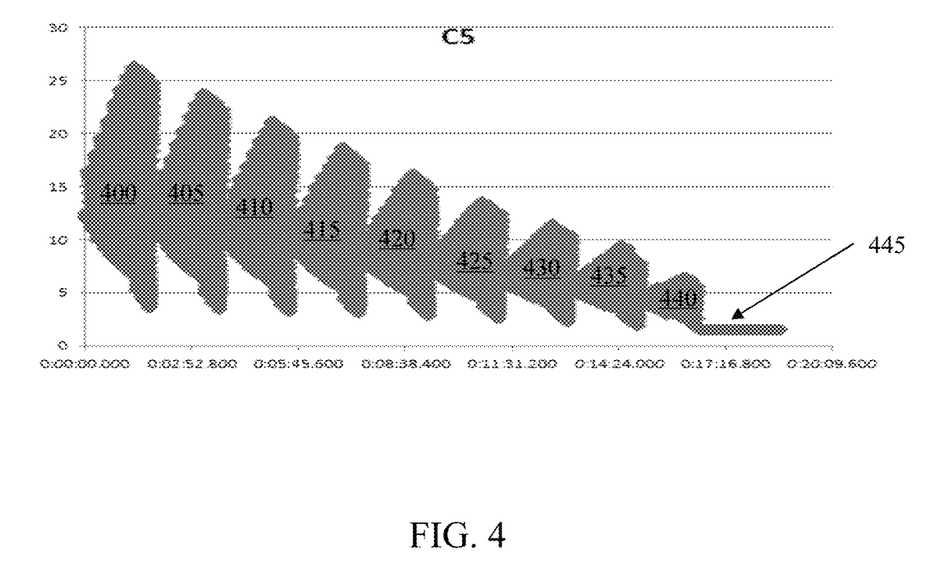
FIG. 4 is a graph showing a capacitor position prior to implementation of embodiments of the present disclosure.

Turning to FIG. 4, a graph showing a capacitor position according prior to implementation of embodiments of the present disclosure is shown. The y-axis is a capacitor position in percentages, while the x-axis is time in seconds. This graph shows a recipe cycle that involves multiple current split ratio condition, e.g., twenty, which is represented by reference character 400. A second cycle is represented by reference character 405. The cycle may then continue to repeat, as evidenced by additional cycles 410, 415, 420, 425, 430, 435, and 440. As the recipe continues over time, the capacitor positions drift downward because the capacitor does not have a single value that resolves a current split condition, which results in infinite solutions. Eventually, the capacitor is not able to find a satisfactory position to tun the current split ratios and rails out, as is evidenced in last cycle 445.

Figure 5:
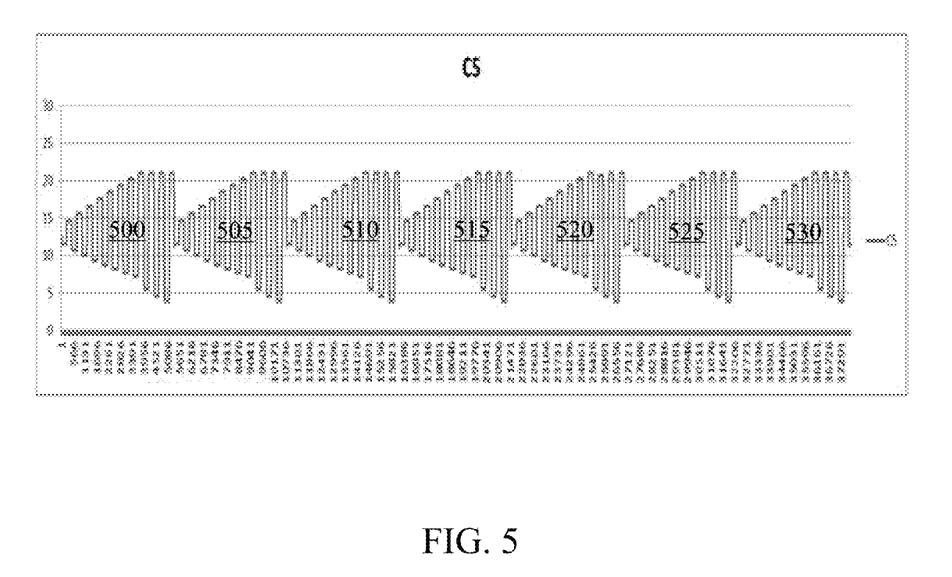
FIG. 5 is a graph showing a capacitor position according to embodiments of the present disclosure.

Turning to FIG. 5, a graph showing a capacitor position according to embodiments of the present disclosure is shown. The y-axis is a capacitor position in percentages, while the x-axis is time in seconds. In this embodiment, the matching network has learned the capacitor positions from a first cycle 500. As such, for each following cycle, the capacitor drives to corresponding positions as were learned in first cycle 500. Cycles 505, 510, 515, 520, 525, and 530 illustrate that capacitor position in employing such a matching network do not drift over time, and the recipe continues to be tuned. Embodiments of the present disclosure may thereby allow capacitor positions to be continuously tuned to achieve optimized operating conditions.

Figure 6:
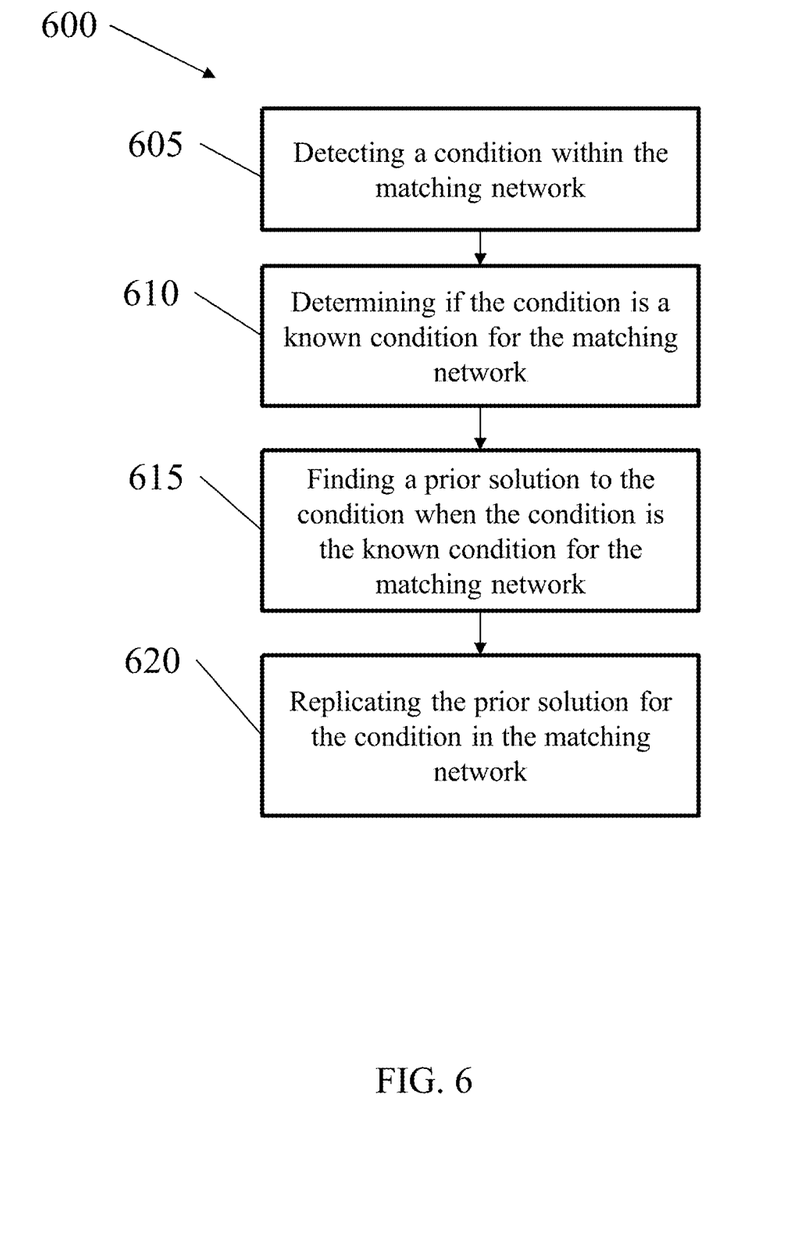
FIG. 6 is a flowchart of a method for tuning a matching network in a radio frequency plasma processing device according to embodiments of the present disclosure.

Turning to FIG. 6, a flowchart of a method for tuning a matching network in a radio frequency plasma processing device, according to embodiments of the present disclosure is shown. In operation, method 600 includes detecting (block 605) a condition within the matching network. The condition may include any of the conditions identified above including, for example, a spike or increase in reflected power. The condition may be identified by one or more sensors located in a reaction chamber, within a matching network, or disposed on or about another component of an associated radio frequency processing device. In certain embodiments, the condition may be recorded and stored in a storage device associated with a tuning module. Depending on the condition being sensed, the sensors may be located in various locations one or about the radio frequency plasma processing device. The recorded and stored condition may then later be used in processing data, identifying condition, and the like.

In operation, method 600 may further include determining (block 610) if the condition is a known condition for the matching network. To determine if the condition is known, a programmable logic controller, or other processing device, may access the storage device to search for existing known conditions. The known conditions may be stored as a database, in tables, etc., thereby allowing access by the programmable logic controller to all existing known conditions. The known conditions may be stored locally or may be located at a remote location.

In operations when, a known condition is not found, the condition that was detected may be recorded in the storage device as a known condition. The known condition may then be available in the future during the detecting and determining aspects of method 600. In certain embodiments, the condition that is recorded may include recording a capacitor position associated with the detected condition.

In operation, method 600 may further include finding (block 615) a prior solution to the condition when the condition is known for the matching network. When a known condition is identified, the known condition may be associated with a prior solution. The known condition had previously occurred, and a solution for the condition was identified. Thus, for each known condition stored in the database there is a corresponding prior solution. Furthermore, if a known condition is not found, there is no prior solution. During operation to resolve the condition, which is now a known condition, a solution is identified. Upon identification of the solution, the solution becomes a prior solution that is associated with a known condition. As such, the database, tables, etc., that include known conditions and prior solutions continues to evolve, through for example, machine learning. As more conditions occur, the robustness of the known prior solutions also increases, thereby increasing the effectiveness of the process. In aspects where the condition that is recorded includes recording a capacitor position associated with the detected condition, the recorded capacitor position may be associated with a prior solution.

In operation, method 600 may further include replicating (block 620) the prior solution for the condition in the matching network. The replication of the solution may include applying the prior solution through, for example, the programmable logic controller, or other processing device, to the matching network. The prior solution may include, for example, setting capacitor positions for one or more capacitors within the matching network. Because there is a prior solution available for the condition, the capacitor position to correct the condition is known, and may thus be applied without the trial and error approach, which may be necessary for an unknown condition or prior solution. As such, the process of replicating the prior solution may be automated, along with the detecting, determining, and finding, identified above. Through automation, a tuning module, which was discussed above with respect to FIG. 3, may more quickly detect a condition and replicate a solution, which in turn increases operational efficiency.

In certain embodiments, the known condition may be determined or previously determined using an empirical data set. The empirical data set may include actual values captured during operation of the matching network, radio frequency processing device, and the like. In certain embodiments, the empirical data set may include current split ratios. The empirical data may be stored in the storage device and be accessed by the programmable logic controller or other processing device. The empirical data may be analyzed by the programmable logic controller and be associated with conditions, known condition, and prior solutions. Thus, the use of empirical data may allow the solutions to be customized for a specific condition, operation, matching network, radio frequency plasma processing device, or other component.

The solution, in certain embodiments, may include a capacitor position that is tuned to a known impedance point. The solution may affect a single capacitor, or in other types of matching networks, the solution may affect two, three, four, or more capacitors. The solution may further adjust other aspect of the matching network.

In certain operations, when the detection occurs, the condition that is detected may not meet a threshold for a known condition, and in such situations method 600 may be discontinued. This may occur, for example, if a value for a parameter of the matching network is not as desired, but does not exceed an operational threshold, so no prior solution is replicated. In certain aspects, for example, a current split ratio may be not be an ideal value, but may be within a tolerance, so no further action is taken. In another example, a current split ratio may be out of a desired operational range but does not match a known condition. In such a situation, a solution would have to be found, and the current split ratio value and solution would be saved to the database as a known condition and a prior solution.

In certain embodiments, replicating the prior solution may include controlling a capacitor speed based on a percentage of reflected power. This is another solution to an identified condition, which may include allowing at least one capacitor in a matching network to tune with a higher reflected power at a limited speed In certain embodiments, the prior solution may include a solution that increases operational efficiency, decreases reflected power more quickly, prevents capacitor railing during operation, or otherwise improves overall tuning time.

Figure 7:
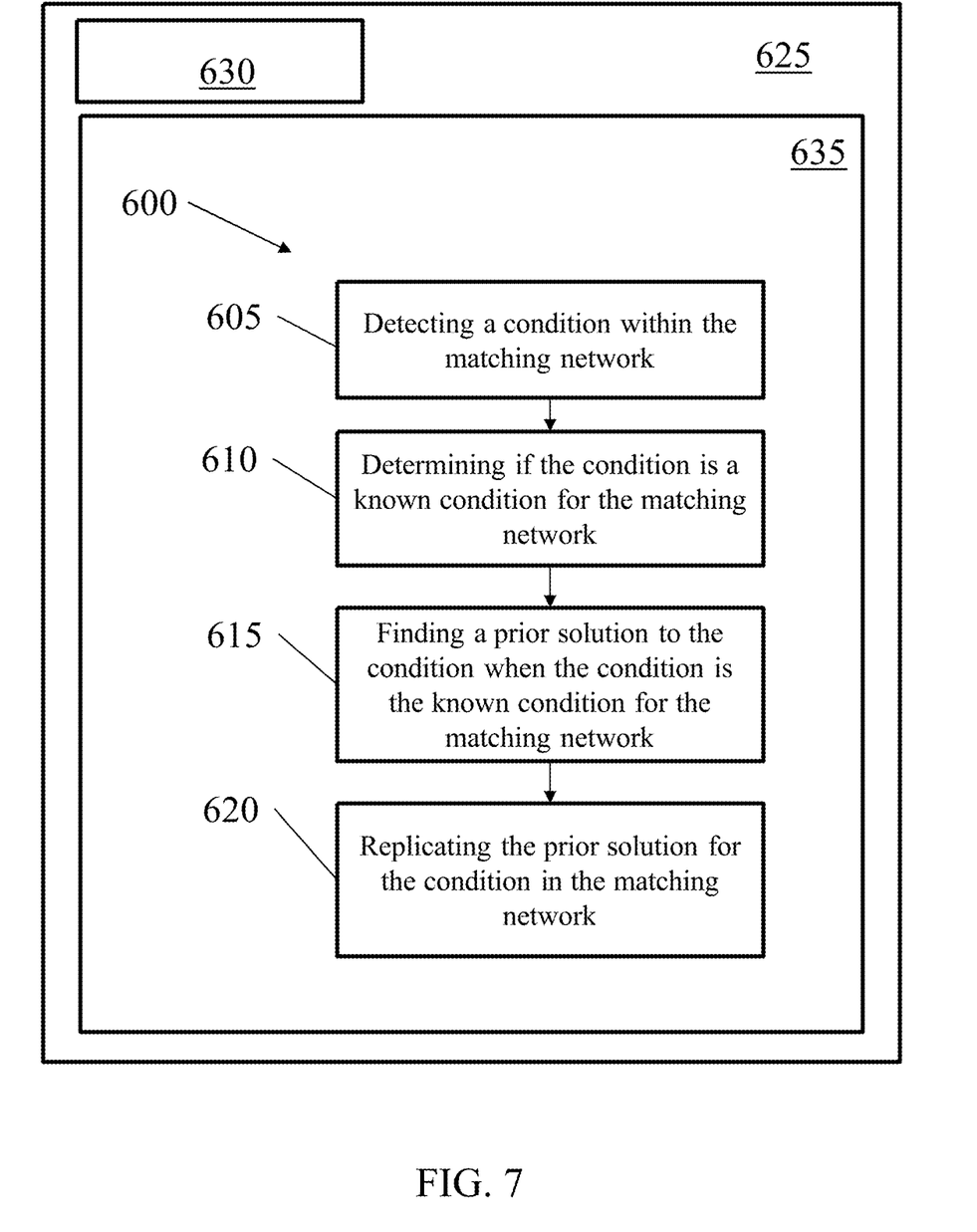
FIG. 7 is an example computing device with a hardware processor and accessible machine-readable instructions in accordance with one or more examples of the present disclosure

Turning now to FIG. 7, an example computing device with a hardware processor and accessible machine-readable instructions is shown in accordance with one or more examples of the present disclosure. FIG. 7 provides the same structural components discussed above with respect to FIG. 6, and as such, for purposes of clarity, only the differences in the figures will be discussed herein. FIG. 7 provides an example computing device 625, with a hardware processor 630, and accessible machine-readable instructions stored on a machine-readable medium 635 for managing data as discussed above with respect to one or more disclosed example implementations. FIG. 6 illustrates computing device 625 configured to perform the flow described in blocks 605, 610, 615, and 620, discussed in detail with respect to FIG. 5. However, computing device 625 may also be configured to perform the flow of other methods, techniques, functions, or processes described in this disclosure.

Figure 8:
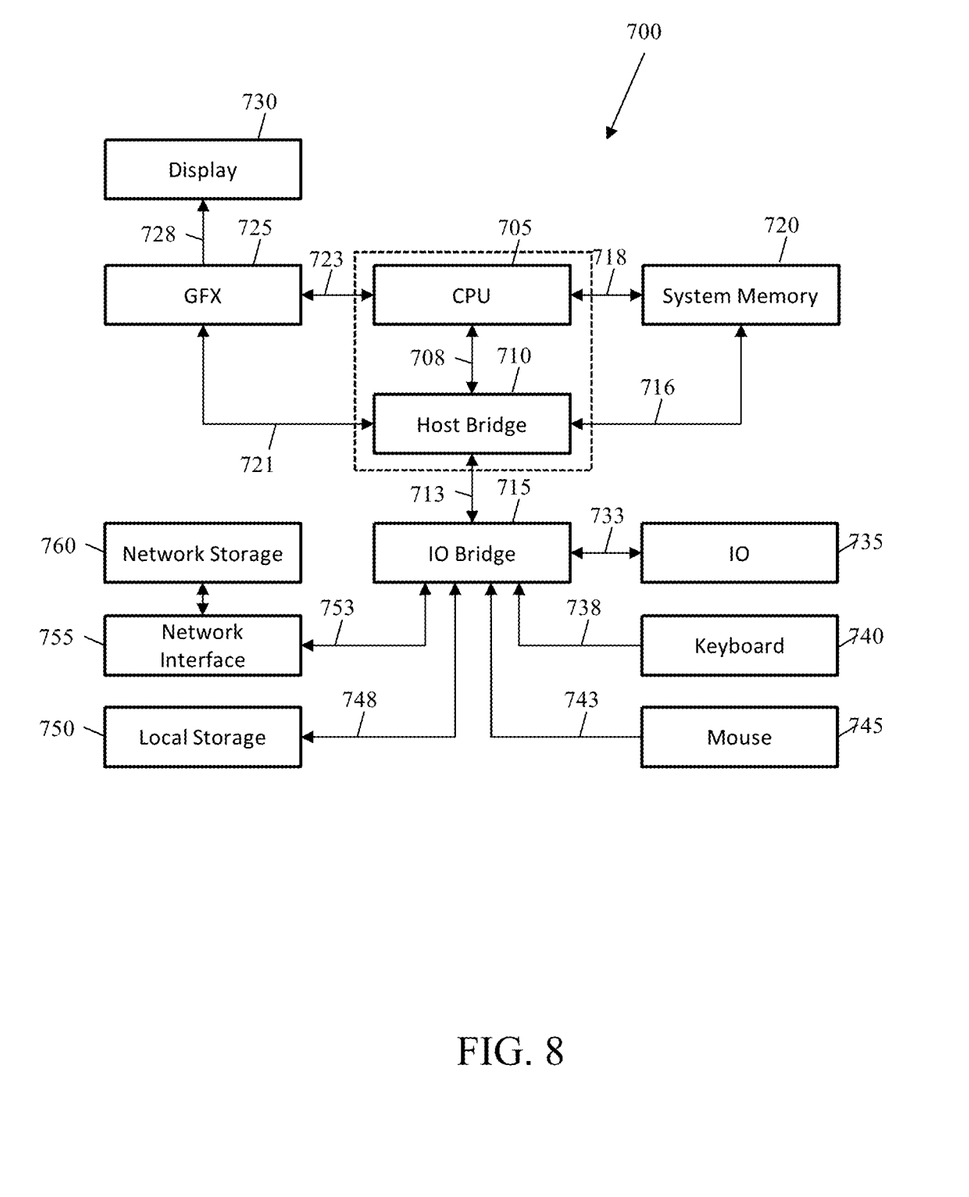
FIG. 8 is a schematic representation of a computer processing device that may be used to implement functions and processes in accordance with one or more examples of the present disclosure

Referring now to FIG. 8, a schematic representation of a computer processing device 700 that may be used to implement functions and processes in accordance with one or more examples of the present disclosure is shown. FIG. 7 illustrates a computer processing device 700 that may be used to implement the systems, methods, and processes of this disclosure. For example, computer processing device 700 illustrated in FIG. 7 could represent a client device or a physical server device and include either hardware or virtual processor(s) depending on the level of abstraction of the computing device. In some instances (without abstraction), computer processing device 700 and its elements, as shown in FIG. 7, each relate to physical hardware. Alternatively, in some instances one, more, or all of the elements could be implemented using emulators or virtual machines as levels of abstraction. In any case, no matter how many levels of abstraction away from the physical hardware, computer processing device 700 at its lowest level may be implemented on physical hardware. In one implementation, computer processing device 700 may allow a subscriber to remotely access one or more data centers. Similarly, the management tool used by the subscriber may include a software solution that runs on such a computer processing device 700.

FIG. 7 shows a computer processing device 700 in accordance with one or more examples of the present disclosure. Computer processing device 700 may be used to implement aspects of the present disclosure, such as aspects associated with the tuning module, the matching network, or other components of a radio frequency plasma processing device. Computer processing device 700 may include one or more central processing units (singular "CPU" or plural "CPUs") 705 disposed on one or more printed circuit boards (not otherwise shown). Computer processing device 700 may further include any type of processing deice or programmable logic controller known in the ark.

Each of the one or more CPUs 705 may be a single-core processor (not independently illustrated) or a multi-core processor (not independently illustrated). Multi-core processors typically include a plurality of processor cores (not shown) disposed on the same physical die (not shown) or a plurality of processor cores (not shown) disposed on multiple die (not shown) that are collectively disposed within the same mechanical package (not shown). Computer processing device 700 may include one or more core logic devices such as, for example, host bridge 710 and input/output ("IO") bridge 715.

CPU 705 may include an interface 708 to host bridge 710, an interface 718 to system memory 720, and an interface 723 to one or more IO devices, such as, for example, graphics processing unit ("GFX") 725. GFX 725 may include one or more graphics processor cores (not independently shown) and an interface 728 to display 730. In certain embodiments, CPU 705 may integrate the functionality of GFX 725 and interface directly (not shown) with display 730. Host bridge 710 may include an interface 708 to CPU 705, an interface 713 to IO bridge 715, for embodiments where CPU 705 does not include interface 718 to system memory 720, an interface 716 to system memory 720, and for embodiments where CPU 705 does not include integrated GFX 725 or interface 723 to GFX 725, an interface 721 to GFX 725.

One of ordinary skill in the art will recognize that CPU 705 and host bridge 710 may be integrated, in whole or in part, to reduce chip count, motherboard footprint, thermal design power, and power consumption. IO bridge 715 may include an interface 713 to host bridge 710, one or more interfaces 733 to one or more IO expansion devices 735, an interface 738 to keyboard 740, an interface 743 to mouse 745, an interface 748 to one or more local storage devices 750, and an interface 753 to one or more network interface devices 755.

Each local storage device 750 may be a solid-state memory device, a solid-state memory device array, a hard disk drive, a hard disk drive array, or any other non-transitory computer readable medium. Each network interface device 755 may provide one or more network interfaces including, for example, Ethernet, Fibre Channel, WiMAX, Wi-Fi, Bluetooth, EtherCAT, Device Net, Mod Bus, RS-232, or any other network protocol suitable to facilitate networked communications. Computer processing device 700 may include one or more network-attached storage devices 760 in addition to, or instead of, one or more local storage devices 750. Network-attached storage device 760 may be a solid-state memory device, a solid-state memory device array, a hard disk drive, a hard disk drive array, or any other non-transitory computer readable medium. Network-attached storage device 760 may or may not be collocated with computer processing device 700 and may be accessible to computer processing device 700 via one or more network interfaces provided by one or more network interface devices 755.

One of ordinary skill in the art will recognize that computer processing device 700 may include one or more application specific integrated circuits ("ASICs") that are configured to perform a certain function, such as, for example, hashing (not shown), in a more efficient manner. The one or more ASICs may interface directly with an interface of CPU 705, host bridge 710, or IO bridge 715. Alternatively, an application-specific computing device (not shown), sometimes referred to as mining systems, may be reduced to only those components necessary to perform the desired function, such as hashing via one or more hashing ASICs, to reduce chip count, motherboard footprint, thermal design power, and power consumption. As such, one of ordinary skill in the art will recognize that the one or more CPUs 705, host bridge 710, IO bridge 715, or ASICs or various sub-sets, super-sets, or combinations of functions or features thereof, may be integrated, in whole or in part, or distributed among various devices in a way that may vary based on an application, design, or form factor in accordance with one or more example embodiments. As such, the description of computer processing device 700 is merely exemplary and not intended to limit the type, kind, or configuration of components that constitute a computing device suitable for performing computing operations, including, but not limited to, hashing functions. Additionally, one of ordinary skill in the art will recognize that computing device 700, an application specific computing device (not shown), or combination thereof, may be disposed in a standalone, desktop, server, or rack mountable form factor.

One of ordinary skill in the art will recognize that computing device 700 may be a cloud-based server, a server, a workstation, a desktop, a laptop, a netbook, a tablet, a smartphone, a mobile device, and/or any other type of computing device in accordance with one or more example embodiments.

In certain embodiments, advantages of the present disclosure may provide for computer executable instructions for automatically tuning capacitors associated with matching networks in radio frequency plasma processing devices.

In certain embodiments, advantages of the present disclosure may provide improved repeatability of tuning of capacitors associated with matching networks in radio frequency plasma processing devices.

In certain embodiments, advantages of the present disclosure may provide faster tuning of capacitors associated with matching networks in radio frequency plasma processing devices.

In certain embodiments, advantages of the present disclosure may provide a method for a tuning module to learn as conditions occur, thereby increases a number of known solutions for particular conditions.

In certain embodiments, advantages of the present disclosure may provide a method for storing specific recipes for operation, which may include specific current split ratio tables, which may decrease the number of conditions that occurring during operation.

In certain embodiments, advantages of the present disclosure may provide systems and methods to decrease reflected power in radio frequency plasma processing devices.

The foregoing description, for purposes of explanation, used specific nomenclature to provide a thorough understanding of the disclosure. However, it will be apparent to one skilled in the art that the specific details are not required to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. A method for repetitive tuning of a matching network in a radio frequency plasma processing device, the method including:
   detecting a condition within the matching network;
   determining that the condition is a previously resolved condition for the matching network, the previously resolved condition having a prior solution that was learned, during operation of the matching network, and then stored as part of a data set of solutions to previously resolved conditions;
   obtaining the prior solution to the condition from the stored data set of solutions to previously resolved conditions; and
   replicating the prior solution for the condition in the matching network.

2. The method of claim 1, wherein the previously resolved condition is determined using an empirical data set.

3. The method of claim 2, wherein the empirical data set comprises current split ratios.

4. The method of claim 3, further comprising storing the empirical data in a storage medium accessible by a programmable logic controller that is connected to the matching network.

5. The method of claim 1, wherein the prior solution comprises a capacitor position that is tuned to a previously learned impedance point.

6. The method of claim 1, wherein the detecting, determining, obtaining, and replicating are automatic when the condition occurs within the matching network.

7. The method of claim 1, further comprising determining that the condition does not meet a threshold to determine if the condition is the previously resolved condition for the matching network and discontinuing the method for tuning the matching network.

8. The method of claim 1, wherein the replicating the prior solution comprises controlling a capacitor speed based on a percentage of reflected power.

9. The method of claim 1, further comprising allowing at least one capacitor to tune with a reflected power at a pre-defined speed.

10. The method of claim 1, further comprising recording a capacitor position for the detected condition.

11. The method of claim 10, further comprising associating the recorded capacitor position with the prior solution in the stored data set of solutions to previously resolved conditions.

12. The method of claim 1, wherein use of the prior solution decreases tuning times in the matching network.

13. The method of claim 1, wherein the prior solution prevents capacitor railing during operation.

14. A radio frequency plasma processing device comprising:
   a reaction chamber;
   a radio frequency generator to supply radio frequency power to a plasma in the reaction chamber;
   a matching network comprising:
      a matching branch having a first variable capacitor and a second variable capacitor; and
      a splitter branch having a third variable capacitor and a fourth variable capacitor that are electrically connected to the first variable capacitor and the second variable capacitor;
   an outer coil connected to the third variable capacitor;
   an inner coil connected to the fourth variable capacitor; and
   a programmable logic controller connected to the matching network, the programmable logic controller to:
      detect a condition within the matching network;
      determine if the condition is a known condition for the matching network;
      find a prior solution to the condition when the condition is the known condition for the matching network; and
      replicate the prior solution for the condition in the matching network.

15. The radio frequency plasma processing device of claim 14, further comprising a tuning module connected to the matching network, the tuning module to store at least the condition and the prior solution.

16. The radio frequency plasma processing device of claim 15, wherein the tuning module stores empirical data comprising transformer coupled capacitively tuning ratios.

17. The radio frequency plasma processing device of claim 15, wherein a tuned capacitor position for at least one of the first variable capacitor, the second variable capacitor, the third variable capacitor, and the fourth variable capacitor is recorded and stored by the tuning module.

18. The radio frequency plasma processing device of claim 14, wherein the programmable logic controller receives values from at least one sensor associated with at least the third variable capacitor and the fourth variable capacitor.

19. The radio frequency plasma processing device of claim 14, wherein a tuned capacitor position for at least one of the first variable capacitor, the second variable capacitor, the third variable capacitor, and the fourth variable capacitor is recorded and stored by the memory module.

20. A non-transitory computer readable medium comprising computer executable instructions stored thereon that, when executed by one or more processing units cause the one or more processing units to:
   detect a condition within the matching network;
   determine that the condition is a previously resolved condition for the matching network, the previously resolved condition having a prior solution that was learned, during operation of the matching network, and then stored as part of a data set of solutions to previously resolved conditions;
   obtain the prior solution to the condition from the stored data set of solutions to previously resolved conditions; and
   replicate the prior solution for the condition in the matching network.

* * * * *